United States Patent
Jung et al.

(10) Patent No.: US 12,100,463 B2
(45) Date of Patent: Sep. 24, 2024

(54) SEMICONDUCTOR MEMORY DEVICE DETECTING DEFECT, AND OPERATING METHOD THEREOF

(71) Applicant: SAMSUNG ELECTRONICS CO., LTD., Suwon-si (KR)

(72) Inventors: Bongkil Jung, Seoul (KR); Sangwan Nam, Hwaseong-si (KR); Keeho Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 51 days.

(21) Appl. No.: 17/954,663

(22) Filed: Sep. 28, 2022

(65) Prior Publication Data

US 2023/0121078 A1 Apr. 20, 2023

(30) Foreign Application Priority Data

Oct. 20, 2021 (KR) .......................... 10-2021-0140488

(51) Int. Cl.
*G11C 29/12* (2006.01)
*G11C 29/02* (2006.01)
*G11C 29/14* (2006.01)
*G11C 29/20* (2006.01)
*G11C 16/04* (2006.01)

(52) U.S. Cl.
CPC ...... *G11C 29/12015* (2013.01); *G11C 29/025* (2013.01); *G11C 29/14* (2013.01); *G11C 29/20* (2013.01); *G11C 16/0483* (2013.01)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,368,418 B2 | 2/2013 | Hasegawa |
| 8,386,980 B2 | 2/2013 | Murray et al. |
| 8,553,466 B2 | 10/2013 | Han et al. |
| 8,559,235 B2 | 10/2013 | Yoon et al. |
| 8,654,587 B2 | 2/2014 | Yoon et al. |
| 10,120,740 B2 | 11/2018 | Lea et al. |

(Continued)

FOREIGN PATENT DOCUMENTS

| | | |
|---|---|---|
| JP | 2002-073364 A | 3/2002 |
| JP | 2002-246991 A | 8/2002 |

(Continued)

*Primary Examiner* — Alfredo Bermudez Lozada
(74) *Attorney, Agent, or Firm* — Muir Patent Law, PLLC

(57) ABSTRACT

Provided are a memory device detecting a defect and an operating method thereof. The memory device includes a memory cell area including a memory cell array that stores data, and a peripheral circuit area including a control logic configured to control operations of the memory cell array, wherein the peripheral circuit area further includes a defect detection circuit, the defect detection circuit being configured to generate a count result value by selecting a first input signal from a plurality of input signals and counting at least one time interval of the first input signal based on a clock signal, and to detect a defect of the first input signal by comparing an expected value with the count result value, and the at least one time interval is a length of time in which logic low or logic high is maintained.

20 Claims, 9 Drawing Sheets

(56) References Cited

U.S. PATENT DOCUMENTS

| | | |
|---|---|---|
| 10,643,734 B2 | 5/2020 | Mohr et al. |
| 2011/0231738 A1 | 9/2011 | Horisaki |
| 2011/0233648 A1 | 9/2011 | Seol et al. |
| 2019/0147961 A1* | 5/2019 | Lee .................... G11C 8/08 365/185.05 |
| 2022/0035597 A1 | 2/2022 | Jung |

FOREIGN PATENT DOCUMENTS

| | | |
|---|---|---|
| KR | 10-1999-0079785 A | 11/1999 |
| KR | 10-0883735 B1 | 2/2009 |

* cited by examiner

SEMICONDUCTOR MEMORY DEVICE DETECTING DEFECT, AND OPERATING METHOD THEREOF

CROSS-REFERENCE TO RELATED APPLICATION

This application is based on and claims priority under 35 U.S.C. § 119 to Korean Patent Application No. 10-2021-0140488, filed on Oct. 20, 2021, in the Korean Intellectual Property Office, the disclosure of which is incorporated by reference herein in its entirety.

BACKGROUND

1. Field

Embodiments relate to a semiconductor memory device detecting a defect and an operating method thereof.

2. Description of the Related Art

As the amount of data to be processed by electronic devices increases, memory devices with high capacity and high bandwidth are in demand. To improve a degree of integration of a semiconductor memory, three-dimensional (3D) arrangement technology in which a plurality of memory chips are stacked via a two-dimensional (2D) method used in the related art has begun to be applied.

SUMMARY

According to an embodiment, there is provided a memory device including a memory cell area including a memory cell array that stores data, and a peripheral circuit area including a control logic configured to control operations of the memory cell array, wherein the peripheral circuit area further includes a defect detection circuit, the defect detection circuit being configured to generate a count result value by selecting a first input signal from among a plurality of input signals and counting at least one time interval of the first input signal based on a clock signal, and to detect a defect of the first input signal by comparing an expected value with the count result value, and the at least one time interval is a length of time in which logic low or logic high is maintained.

According to another embodiment, there is provided a memory device including a memory cell array that stores data, a finite state machine (FSM) configured to output a plurality of state signals in response to a command for an operation of the memory cell array, and a defect detection circuit configured to detect a defect of a first state signal by measuring a duration of the first state signal in the plurality of state signals, wherein the defect detection circuit includes a signal selection block configured to select the first state signal from among the plurality of state signals, a counter block configured to generate a count value by counting a duration when the first state signal is at least one of logic 1 and logic 0, and a comparator block configured to output a comparison result value according to a comparison result of an expected value and the count value.

According to another embodiment, there is provided a defect detection method of a memory device, the method including selecting a first control signal from among a plurality of control signals, generating a count result value by counting, after the first control signal is first toggled, a time interval, in which a high level or a low level is maintained, based on a representative clock signal, comparing the count result value of the first control signal with a representative target count value, and detecting that the first control signal is defective when the count result value is different from the representative target count value, wherein the first control signal is independently counted for each of time intervals in which the high level and the low level are respectively maintained. In addition, according to the defect detection method of a memory device, the representative clock signal is selected from one of a first clock signal input from a memory controller and a second clock signal output from an oscillator in the memory device, and the representative target count value is selected from one of a first target count value input from the memory controller and a second target count value calculated from information related to an operation of the first control signal. According to the defect detection method of a memory device, the generating of the count result value by counting, after the first control signal is first toggled, a time interval, in which a high level or a low level is maintained, based on a representative clock signal further includes counting the time interval at a rising edge of the representative clock signal by using a first counter circuit, and counting the time interval at a falling edge of the representative clock signal by using a second counter circuit. In addition, according to the defect detection method of a memory device, the plurality of control signals include interface signals configured to control an operation of a memory cell array in the memory device, and the selecting of the first control signal includes selecting the first control signal from among the plurality of control signals according to an external command input from the memory controller.

BRIEF DESCRIPTION OF THE DRAWINGS

Features will become apparent to those of skill in the art by describing in detail example embodiments with reference to the attached drawings in which.

DETAILED DESCRIPTION

Figure 1:
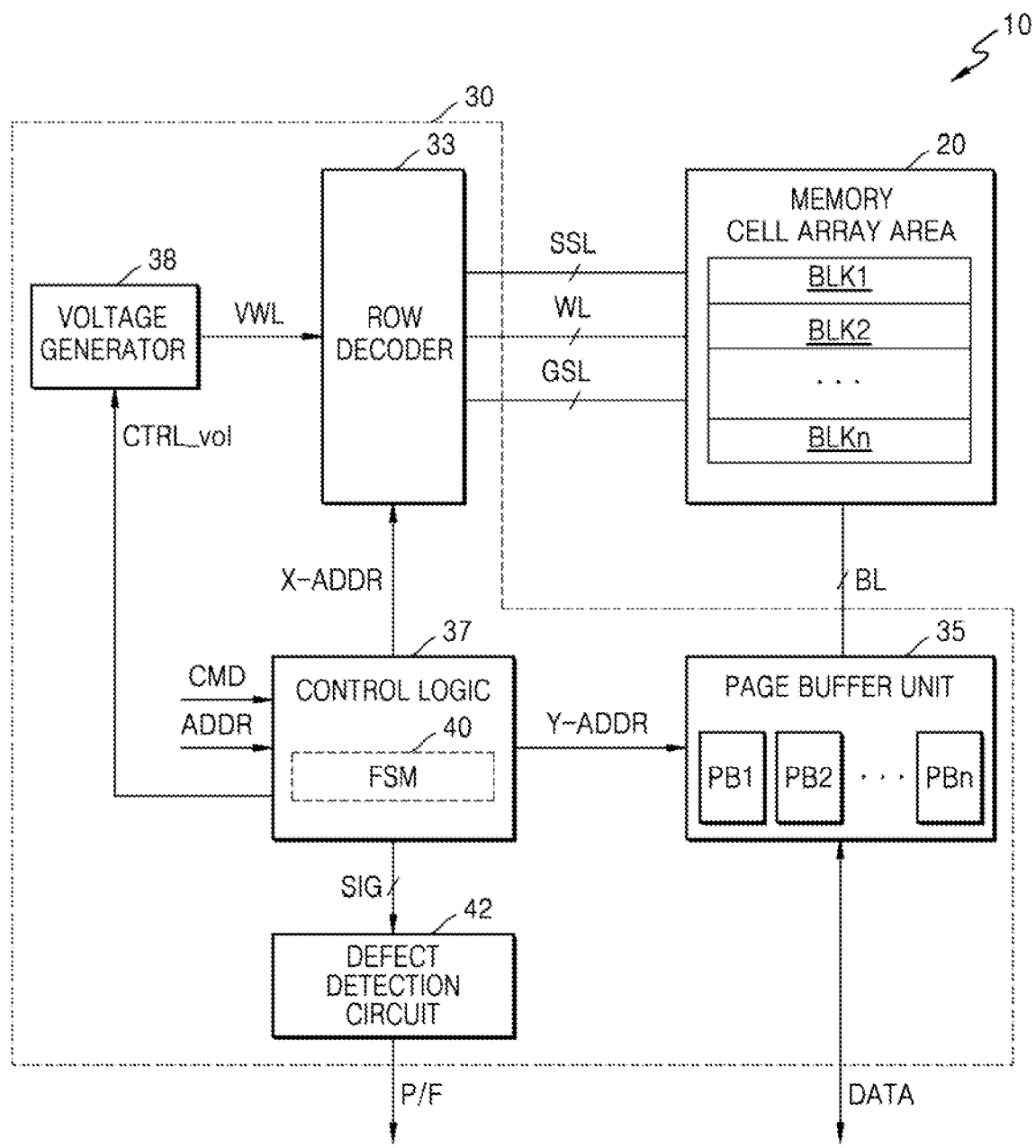
FIG. 1 is a schematic block diagram of a semiconductor memory device according to an example embodiment.

FIG. 1 is a schematic block diagram of a semiconductor memory device 10 according to an example embodiment.

Referring to FIG. 1, the semiconductor memory device 10 according to an example embodiment may include a memory cell array area 20 and a peripheral circuit area 30.

A plurality of memory cell blocks BLK1 to BLKn may be in the memory cell array area 20. Each of the plurality of memory cell blocks BLK1 to BLKn may include a plurality of memory cells. The plurality of memory cell blocks BLK1 to BLKn may be connected to the peripheral circuit area 30 via bit lines BL, word lines WL, string selection lines SSL, and ground selection lines GSL.

In particular, the memory cell array area 20 may be connected to a row decoder 33 via the word lines WL, the string selection lines SSL, and the ground selection lines GSL, and may be connected to a page buffer unit 35 via the bit lines BL.

In an example embodiment, a three-dimensional memory cell array may be in the memory cell array area 20, and the three-dimensional memory cell array may include a plurality of NAND strings. Each of the plurality of NAND strings may include memory cells respectively connected to the word lines WL vertically stacked on a substrate. U.S. Pat. Nos. 7,679,133, 8,553,466, 8,654,587, 8,559,235, and U.S. Patent Application Publication No. 2011/0233648 are incorporated herein in their entirety by reference. In an example embodiment, the memory cell array area 20 may include a two-dimensional memory cell array, and the two-dimensional memory cell array may include a plurality of NAND strings arranged in row and column directions.

The peripheral circuit area 30 may receive an address ADDR, a command CMD, and a control signal CTRL from the outside of the semiconductor memory device 10, and transmit and receive data DATA to and from a device outside the semiconductor memory device 10. The peripheral circuit area 30 may include a control logic 37, a defect detection circuit 42, the row decoder 33, the page buffer unit 35, and a voltage generator 38 that generates various voltages used for operations of components in the semiconductor memory device 10. Although not illustrated in FIG. 1, the semiconductor memory device 10 may further include a memory interface (I/F) circuit 93 shown in FIG. 9, and may also further include a column logic, a pre-decoder, a temperature sensor, a command decoder, an address decoder, or the like. In addition, although not illustrated in FIG. 1, the peripheral circuit area 30 may further include various sub-circuits, such as an input/output circuit, an error correction circuit for correcting an error in the data DATA read from the memory cell array area 20 of the semiconductor memory device 10, or the like.

The control logic 37 may generally control various operations within the semiconductor memory device 10, and may include a finite state machine 40 (FSM 40). The FSM 40 may be or include a circuit that outputs state signals SIG according to the command CMD and/or the control signal CTRL input from the outside and a time change. However, the FSM 40 may be included in other configurations in the peripheral circuit area 30.

The control logic 37 may output various control signals in response to the command CMD and/or the address ADDR from a memory I/F circuit (not shown). For example, the control logic 37 may output a voltage control signal CTRL_vol, a row address X-ADDR, and a column address Y-ADDR. The control logic 37 may generate various internal control signals used in the semiconductor memory device 10. For example, the control logic 37 may adjust voltage levels provided to the word lines WL and the bit lines BL when performing a memory operation such as a program operation, a read operation, an erase operation, or the like.

The defect detection circuit 42 may select one of the state signals SIG in response to the state signals SIG, to detect whether the selected state signal SIG is defective. For example, the defect detection circuit 42 may generate a count result value by selecting a first state signal from among the state signals SIG and counting, based on a clock signal, a time interval in which logic high (or logic low) of the first state signal is maintained.

For example, when the first state signal is a normal signal, it is assumed that a count value of the first state signal based on a clock signal is 8 during a time interval in which logic high is maintained. When the first state signal is delayed at a rising edge (e.g., due to a defect in resistance), a count value of the first state signal based on a clock signal is 6 during a time interval in which logic high is maintained.

Although FIG. 1 illustrates that the defect detection circuit 42 receives the state signals SIG from the control logic 37, this is merely an example embodiment. In another example embodiment, the defect detection circuit 42 may receive a plurality of signals input/output between components (e.g., the row decoder 33, the page buffer unit 35, or the like) in the peripheral circuit area 30. A signal input to and tested in the defect detection circuit 42 may be referred to as a 'state signal', an 'input signal', or a 'control signal'. The defect detection circuit 42 will be described in detail with reference to FIGS. 2 and 3.

The row decoder 33 may select one of a plurality of word lines WL and select one of a plurality of string selection lines SSL, in response to the row address X-ADDR. For example, during a program operation, the row decoder 33 may apply a program voltage and a program verify voltage to the selected word line WL, and may apply a read voltage to the selected word line WL during a read operation.

The page buffer unit 35 may include a plurality of page buffers PB1 to PBn (where n is an integer equal to or greater than 3), and the plurality of page buffers PB1 to PBn may be respectively connected to memory cells through a plurality of bit lines BL. The page buffer unit 35 may select at least one bit line BL from among the plurality of bit lines BL in response to the column address Y-ADDR. The page buffer unit 35 may operate as a writer driver or a sense amplifier according to an operation mode of the semiconductor memory device 10. For example, during a program operation, the page buffer unit 35 may apply a bit line voltage corresponding to data DATA to be programmed to the selected bit line BL. During a read operation, the page buffer unit 35 may sense data DATA stored in the memory cell array area 20 by sensing a current or voltage of the selected bit line BL.

The voltage generator 38 may generate various types of voltages for performing program, read, and erase operations based on the voltage control signal CTRL_vol. For example, the voltage generator 38 may generate a program voltage, a read voltage, a program verify voltage, an erase voltage, or the like as a word line voltage VWL. FIG. 1 illustrates that the word line voltage VWL is provided to the row decoder 33, but this may be implemented differently. Voltages used for an operation of the semiconductor memory device 10 such as the page buffer unit 35, the control logic 37, or the like may be provided.

Figure 2:
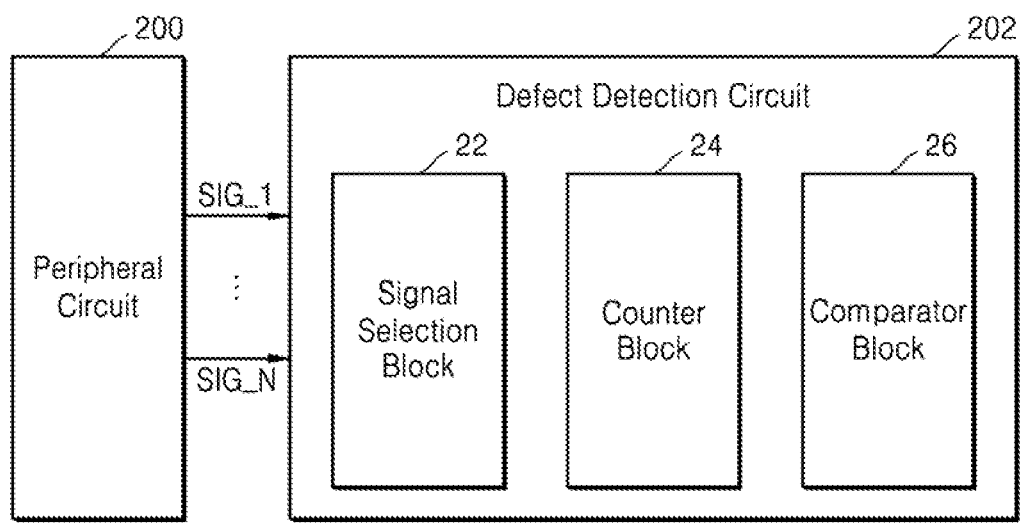
FIG. 2 is a block diagram illustrating structures of a peripheral circuit and a defect detection circuit according to an example embodiment.

FIG. 2 is a block diagram illustrating structures of a peripheral circuit 200 and a defect detection circuit 202 according to an example embodiment.

Referring to FIGS. 1 and 2, the peripheral circuit 200 and the defect detection circuit 202 may be arranged in the peripheral circuit area 30 (in FIG. 1). The peripheral circuit 200 may include various sub-blocks for operating the memory cell array area 20 such as the row decoder 33, the page buffer unit 35, the control logic 37, and/or the voltage generator 38. The peripheral circuit 200 may select and control memory cells storing data.

The defect detection circuit 202 may include a signal selection block 22, a counter block 24, and a comparator block 26, and may receive a plurality of control signals SIG_1 to SIG_N from the peripheral circuit 200. The plurality of control signals SIG_1 to SIG_N may be control signals and interface signals input or output between the sub-blocks in the peripheral circuit 200, e.g., internal interface signals. For example, the first control signal SIG_1 may be a command (CMD) flag signal for a command of a program, read, or erase operation, and a second control signal SIG_2 may be a voltage enable signal generating an initial voltage among interval signals in a read command. A third control signal SIG_3 may be a signal for initializing the page buffer unit 35 (in FIG. 1), among the interval signals in the read command. In some example embodiments, the plurality of control signals SIG_1 to SIG_N may be state signals output by the control logic 37 in the peripheral circuit 200. The plurality of control signals SIG_1 to SIG_N may be selected from among all control signals of the peripheral circuit 200 by an external command from the outside of the semiconductor memory device 10 (in FIG. 1), and may be input to the defect detection circuit 202.

The signal selection block 22 may select one of the plurality of control signals SIG_1 to SIG_N according to an external command. The signal selection block 22 may include at least one multiplexer, and may be connected to a pad (not shown) that monitors a connection to the outside and measures a voltage signal. In addition, the signal selection block 22 may provide one selected control signal, e.g., an M-th control signal SIG_M shown in FIGS. 3A and 3B (where M is an integer of 1≤M≤N) to the counter block 24.

The counter block 24 may receive the selected M-th control signal SIG_M from the signal selection block 22, and may count at least one time interval of the M-th control signal SIG_M based on a clock signal to generate a count result value. A time interval may be defined as a length of time in which the M-th control signal SIG_M is maintained at a particular level (e.g., a high level or a low level). The time interval may also be referred to as a duration.

According to an example embodiment, a method of counting at least one time interval of the M-th control signal SIG_M may be selected from one method from among four options. Hereinafter, for the sake of explanation an example will be described in which it is assumed that the counter block 24 receives the first control signal SIG_1, and the first control signal SIG_1 is a signal that repeats rising or falling at particular timings and transitions between a high level and a low level. Among the four options, a first option may be defined as a method of counting each of all time intervals having a high level. A second option may be defined as a method of counting each of all time intervals having a low level. A third option may be defined as a method of counting each of all time intervals having a low level and each of all time intervals having a high level after first toggling from a low level to a high level. A fourth option may be defined as a method of counting each of all time intervals having a low level and each of all time intervals having a high level after first toggling from a high level to a low level. Herein, a high level may be referred to as logic high or logic 1, and a low level may be referred to as logic low or logic 0. Details of four options corresponding to methods of counting a time interval will be described below with reference to FIG. 4.

In the present example, the counter block 24 may be set to count in a method corresponding to the first option, and the first control signal SIG_1 may be a signal in which maintaining a high level for one microsecond (μs) is set as a target. The counter block 24 may generate a count result value by counting, based on a clock signal, a time interval in which the first control signal SIG_1 is maintained at a high level. When the first control signal SIG_1 is a normal signal, as a result of counting a time interval in which the first control signal SIG_1 is maintained at a high level based on a clock signal, a count value of the first control signal SIG_1 may be obtained by the counter block 24 as 8. On the contrary, when the first control signal SIG_1 is a defective signal, as a result of counting a time interval in which the first control signal SIG_1 is maintained at a high level based on a clock signal, a count value of the first control signal SIG_1 may be obtained by the counter block 24 as 6.

According to an example embodiment, a time interval in which a count operation is performed, that is, at least one time interval of the M-th control signal SIG_M, may be selected depending on whether a memory cell operates. It may be selected whether to perform counting when at least one memory cell in the memory cell array area 20 (in FIG. 1) performs a program, read, or erase operation, that is, when an operation state is in a busy state, or it may be selected whether to perform counting when at least one memory cell in the memory cell array area 20 (in FIG. 1) does not perform a program, read, or erase operation, that is, when the operation state is in a ready state.

According to an example embodiment, the counter block 24 may generate a count result value by counting a particular time interval at a rising edge of a clock signal. Alternatively, the counter block 24 may generate a count result value by counting a particular time interval at a falling edge of a clock signal.

In some example embodiments, the counter block 24 may include a plurality of sub-counter circuits. The counter block 24 may include a first sub-counter circuit and a second sub-counter circuit, and may generate a count result value by counting, by the first sub-counter circuit, a particular time interval at a rising edge of a clock signal, and counting, by the second sub-counter circuit, a particular time interval at a falling edge of the clock signal. The counter block 24 including the plurality of sub-counter circuits will be described in detail below with reference to FIG. 3B.

According to an example embodiment, the comparator block 26 may receive a count result value from the counter block 24, and may also receive an expected value. The expected value may be a target value for the selected M-th control signal SIG_M, and may be referred to as a target count value. The comparator block 26 may output a comparison result value by comparing the count result value with the expected value, and may detect a defect in the M-th control signal SIG_M.

Figure 3A:
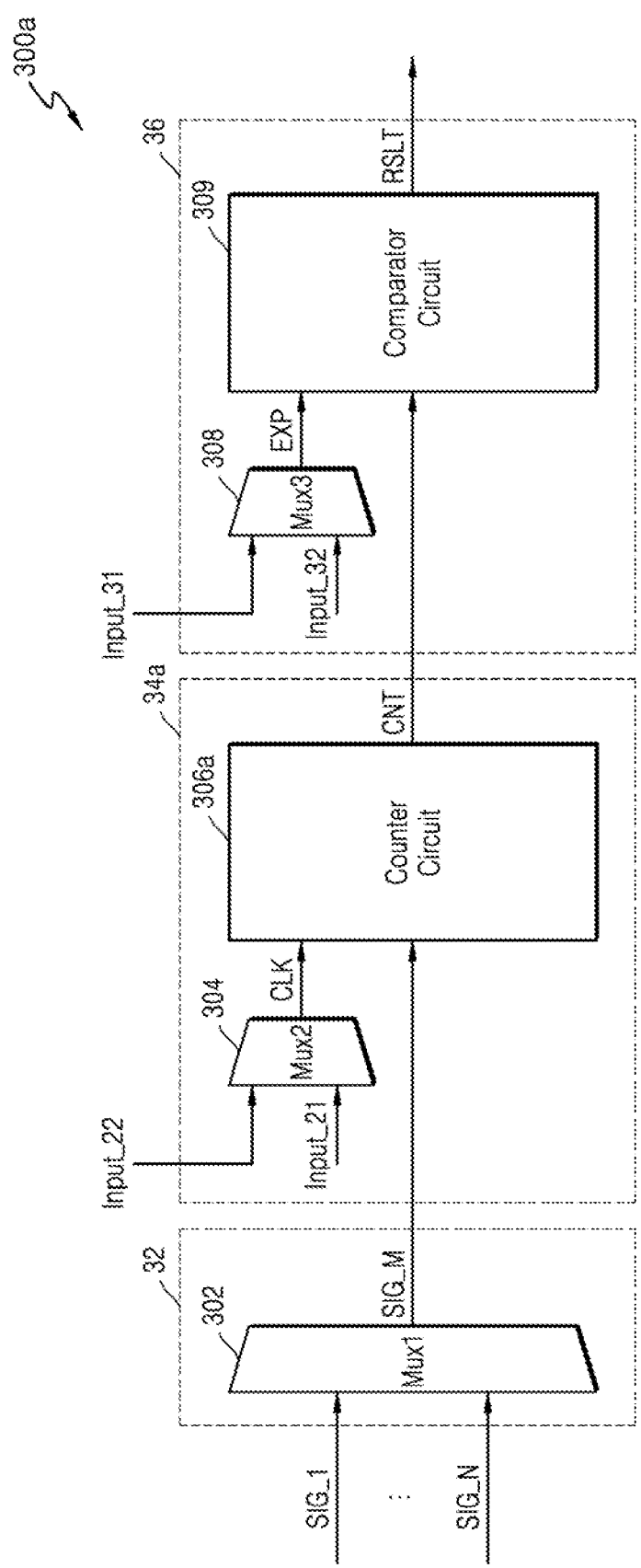
FIG. 3A is a circuit diagram of a defect detection circuit including a counter block according to an example embodiment.
Figure 3B:
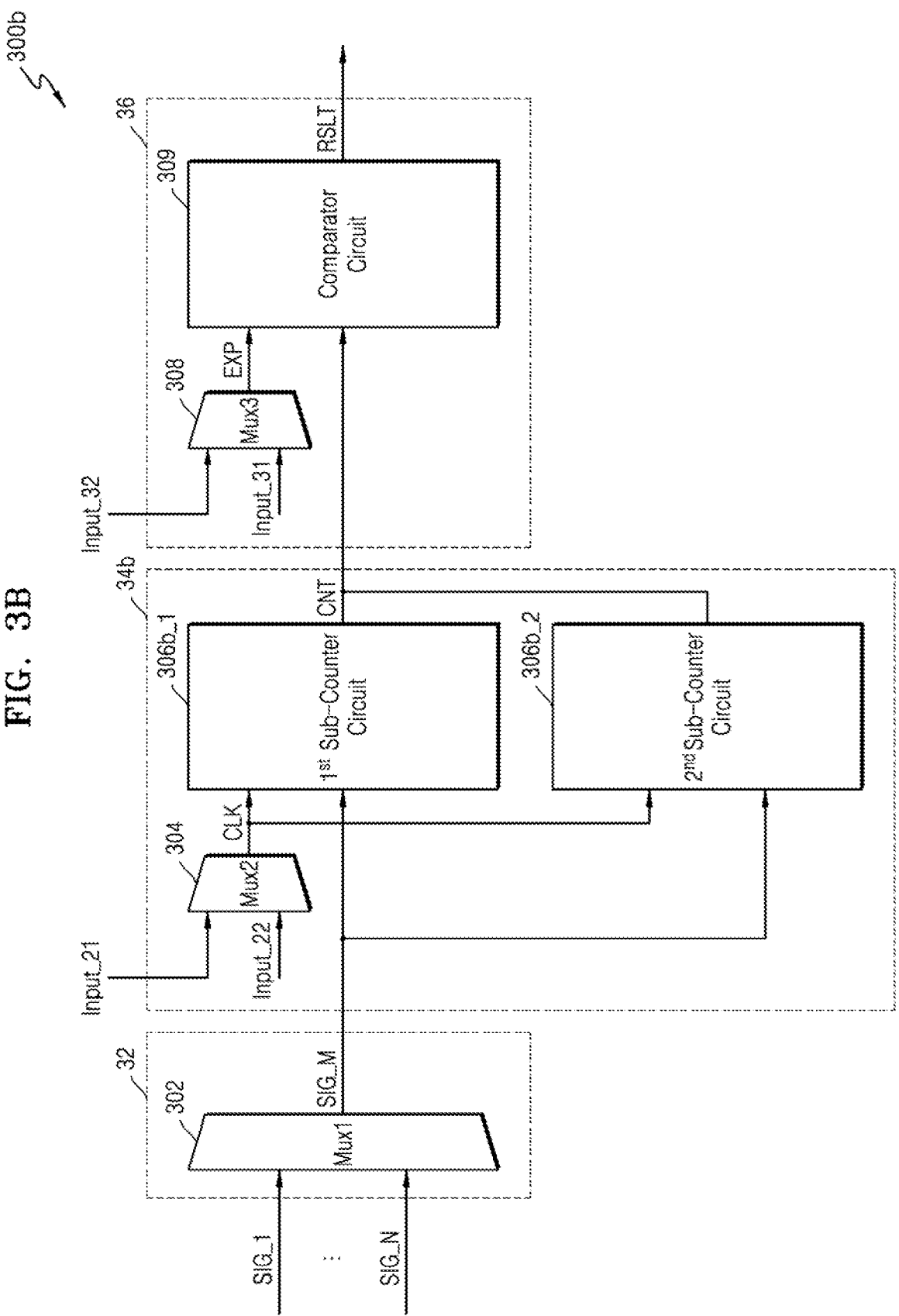
FIG. 3B is a circuit diagram of a defect detection circuit including a counter block according to an example embodiment.

FIG. 3A is a circuit diagram of a defect detection circuit 300a including a counter block 34a according to an example embodiment, and FIG. 3B is a circuit diagram of a defect detection circuit 300b including a counter block 34b according to an example embodiment.

Referring to FIG. 3A, the defect detection circuit 300a may include a signal selection block 32, a counter block 34a, and a comparator block 36. Referring to FIGS. 2 and 3A, the signal selection block 32, the counter block 34a, and the comparator block 36 of FIG. 3A may be respectively applied to the signal selection block 22, the counter block 24, and the comparator block 26 in the defect detection circuit 202 of FIG. 2.

According to an example embodiment, the signal selection block 32 may include a first multiplexer 302 (Mux 1). The first multiplexer 302 may receive the plurality of control signals SIG_1 to SIG_N, and select the M-th control signal SIG_M from among the plurality of control signals SIG_1 to SIG_N. The plurality of control signals SIG_1 to SIG_N may be state signals output from an FSM, or may be internal signals of a peripheral circuit. For example, the M-th control signal SIG_M may be selected by an external command provided from the outside of the semiconductor memory device 10 (in FIG. 1).

The counter block 34a may include a second multiplexer 304 (Mux 2) and a counter circuit 306a. A first input signal Input_21 and a second input signal Input_22 may be input to the second multiplexer 304, and one of the first input signal Input_21 and the second input signal Input_22 may be selected by the second multiplexer 304. A clock signal CLK corresponding to one of the first input signal Input_21 and the second input signal Input_22 may be output from the second multiplexer 304 and transmitted to the counter circuit 306a.

The first input signal Input_21 may be a clock signal generated by an internal oscillator. The second input signal Input_22 may be a clock signal provided from the outside, e.g., an external input clock signal. The second input signal Input_22 may be a clock signal provided from the outside of the semiconductor memory device 10 (in FIG. 1) and also an external input signal. The first input signal Input_21 may be referred to as a first clock signal. The second input signal Input_22 may be referred to as a second clock signal. The clock signal CLK selected from one of the first input signal Input_21 and the second input signal Input_22 by the second multiplexer 304 may be referred to as a representative clock signal CLK.

When only the first input signal Input_21 is used as the clock signal CLK of the counter circuit 306a, a range in which a cycle of the clock signal may vary is limited according to a specification of a corresponding oscillator. According to an example embodiment, the second input signal Input_22 corresponding to an external input signal having a cycle of an arbitrary clock signal may be selected as the clock signal CLK of the counter circuit 306a, and thus the clock signal CLK having various cycles may be applied to the counter circuit 306a.

The counter circuit 306a may receive the representative clock signal CLK from the second multiplexer 304, and may receive the M-th control signal SIG_M from the first multiplexer 302. The counter circuit 306a may generate a count result value CNT by counting a particular time interval of the M-th control signal SIG_M based on the representative clock signal CLK. For example, the M-th control signal SIG_M may include a plurality of time intervals in which logic high is maintained, and the counter circuit 306a may count the number of clock signals during a particular time interval in which logic high is maintained. Assuming that a cycle of the clock signal CLK is 1 μs and logic high is maintained for 8 μs in a particular time interval, the counter circuit 306a may count 8 and output 8 corresponding to the count result value CNT.

The comparator block 36 may include a third multiplexer 308 (Mux 3) and a comparator circuit 309. A third input signal Input_31 and a fourth input signal Input_32 may be input to the third multiplexer 308, and one of the third input signal Input_31 and the fourth input signal Input_32 may be selected by the third multiplexer 308. An expected value EXP corresponding to one of the third input signal Input_31 and the fourth input signal Input_32 may be output from the third multiplexer 308 and transmitted to the comparator circuit 309. An expected value selected from one of the third input signal Input_31 and the fourth input signal Input_32 by the third multiplexer 308 may be referred to as a representative target count value EXP.

The third input signal Input_31 may be a built-in self test value (BIST value) that is a preset value inside the semiconductor memory device 10 (in FIG. 1). The preset value of the third input signal Input_31 may be a value of a combination or an arithmetic operation of information related to an operation of the M-th control signal SIG_M in an electrical-fuse (E-fuse) method. E-fuse may be defined as a method of transmitting information by storing at least one piece of information in a memory cell, and then turning on or off a switch corresponding to information by using the information required for an operation of a memory device. The third input signal Input_31 may be referred to as a first target count value.

The fourth input signal Input_32 may be a count value provided from the outside, e.g., an external input value. The fourth input signal Input_32 may be an expected value provided from the outside of the semiconductor memory device 10 (in FIG. 10) and also an external input signal. For example, the fourth input signal Input_32 may be a value corresponding to 8. The fourth input signal Input_32 may be referred to as a second target count value.

The comparator circuit 309 may receive the representative target count value EXP from the third multiplexer 308 and may receive the count result value CNT from the counter circuit 306a. The comparator circuit 309 may compare an actual count number with an expected count number of the M-th control signal SIG_M during a particular time interval. When the representative target count value EXP is equal to the count result value CNT, the comparator circuit 309 may output a result value RSLT corresponding to a pass, and when the representative target count value EXP is different from the count result value CNT, the comparator circuit 309 may output the result value RSLT corresponding to a failure.

According to the operation described above, a semiconductor memory device including the defect detection circuit 300a according to an example embodiment may determine and detect whether internal signal(s) of a peripheral circuit is normally maintained at a particular level during a time interval in which the particular level is designed to be maintained.

Referring to FIG. 3B, a defect detection circuit 300b may include the signal selection block 32, a counter block 34b, and the comparator block 36. Descriptions already given with reference to FIG. 3A are omitted below.

The counter block 34b may include the second multiplexer 304, a first sub-counter circuit 306b_1, and a second sub-counter circuit 306b_2. The counter block 34b shown in FIG. 3B is only an example embodiment, and the counter block 34b may include three or more sub-counter circuits. The first input signal Input_21 and the second input signal Input_22 may be input to the second multiplexer 304, and one of the first input signal Input_21 and the second input signal Input_22 may be selected by the second multiplexer 304. A representative clock signal CLK corresponding to one of the first input signal Input_21 and the second input signal Input_22 may be output from the second multiplexer 304, and transmitted to the first sub-counter circuit 306b_1 and the second sub-counter circuit 306b_2.

The first sub-counter circuit 306b_1 and the second sub-counter circuit 306b_2 may each generate a count result value CNT by counting a particular time interval in which logic high is maintained at a rising edge of the representative clock signal CLK and counting a particular time interval in which logic high is maintained at a falling edge of the representative clock signal CLK, respectively As described above, when the counter block 34b includes a plurality of sub-counter circuits, a particular time interval may be counted at both the rising edge and the falling edge of a clock signal CLK, and accordingly, the resolution of the defect detection circuit 300b may be increased. The first sub-counter circuit 306b_1 and the second sub-counter circuit 306b_2 may output the count result value CNT to the comparator circuit 309.

Figure 4:
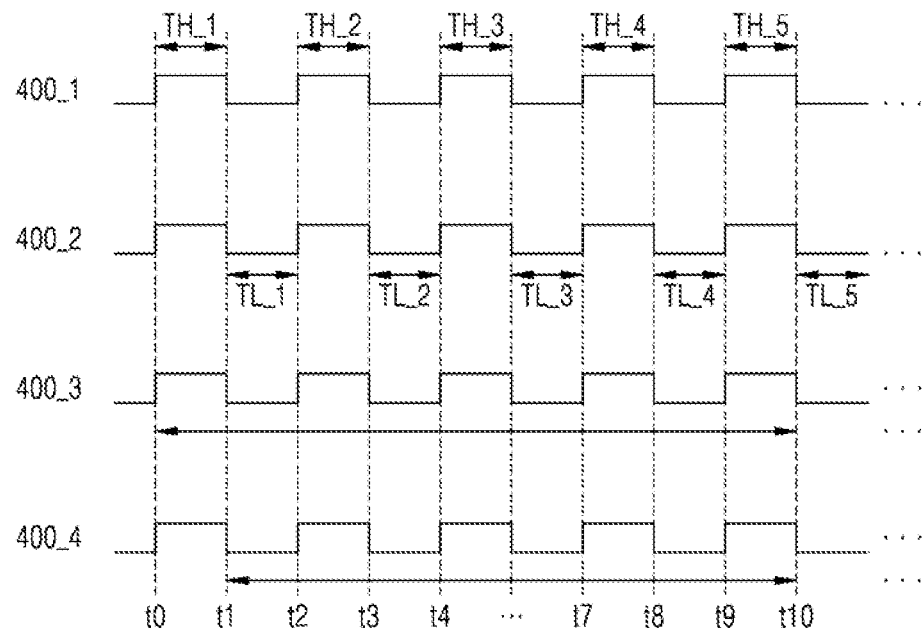
FIG. 4 is a timing diagram illustrating methods in which a counter block counts time intervals, according to an example embodiment.

FIG. 4 is a timing diagram illustrating methods in which the counter block 24 counts time intervals, according to an example embodiment.

Referring to FIG. 4, four options in which the counter block 24 (in FIG. 2) (or the counter circuit 306a) counts a plurality of time intervals of an M-th control signal are shown. Hereinafter, it is assumed that the M-th control signal is the M-th control signal SIG_M in a normal state at particular timings.

According to an example embodiment, according to a first option shown in a first timing diagram 400_1, the counter block 24 may sequentially count (after the M-th control signal SIG_M is first toggled from a low level to a high level at time T=t0) first to fifth high intervals TH_1 to TH_5 in which the M-th control signal is at a high level. Although not illustrated in FIG. 4, counting may be repeated after a sixth high interval.

According to an example embodiment, according to a second option shown in a second timing diagram 400_2, the counter block 24 may sequentially count (after the M-th control signal SIG_M is first toggled from a high level to a low level at time T=t1) first to fifth low intervals TL_1 to TL_5 in which the M-th control signal is at a low level. Although not illustrated in FIG. 4, counting may be repeated after a sixth low interval.

According to an example embodiment, according to a third option shown in a third timing diagram 400_3, the counter block 24 may sequentially count (after the M-th control signal SIG_M is first toggled from a low level to a high level at time T=t0) each of the first to fifth high intervals TH_1 to TH_5 in which the M-th control signal is at a high level and the first to fifth low intervals TL_1 to TL_5 in which the M-th control signal is at a low level. According to the third option, toggling(s) after the first toggling may be ignored.

According to an example embodiment, according to a fourth option shown in a fourth timing diagram 400_4, the counter block 24 may sequentially count (after the M-th control signal SIG_M is first toggled from a high level to a low level at time T=t1) each of the first to fifth high intervals TH_1 to TH_5 in which the M-th control signal is at a high level and the first to fifth low intervals TL_1 to TL_5 in which the M-th control signal is at a low level. According to the fourth option, toggling(s) after the first toggling may be ignored.

Figure 5:
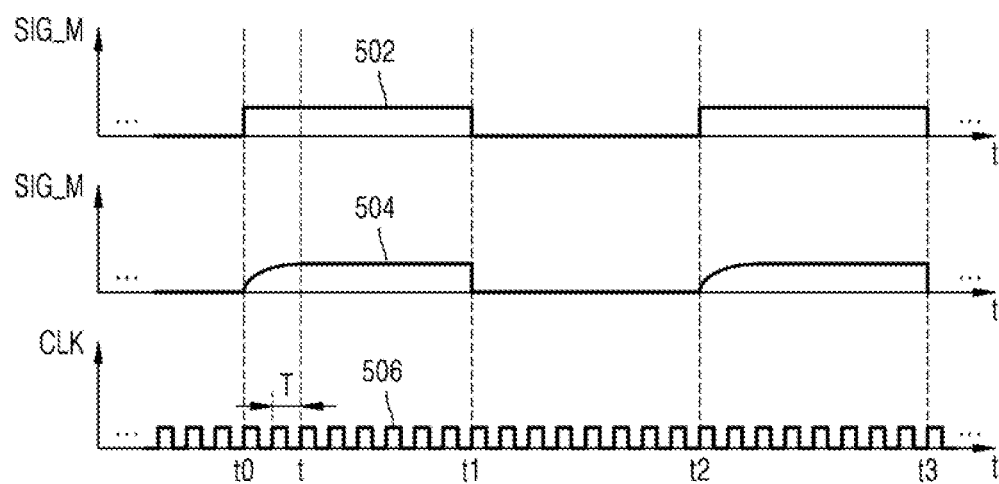
FIG. 5 illustrates timing diagrams of an M-th control signal in states of being a normal signal and a defective signal, and a clock signal, according to an example embodiment.

FIG. 5 illustrates timing diagrams of an M-th control signal in states of being a normal signal and a defective signal, and a clock signal, according to an example embodiment. Hereinafter, descriptions will be made with reference to FIGS. 3A to 4.

Referring to FIG. 5, a timing diagram 502 of the M-th control signal SIG_M in a normal-signal state, a timing diagram 504 of the M-th control signal SIG_M in a defective-signal state, and a timing diagram 506 of the representative clock signal CLK are shown. Hereinafter, referring to FIGS. 3A to 5, it is assumed that an interval in which the M-th control signal SIG_M is at a high level is counted according to the first option, as shown in the first timing diagram 400_1 (in FIG. 4).

Referring to the timing diagram 502 of the M-th control signal SIG_M in a normal-signal state, the M-th control signal SIG_M in a normal-signal state may be a signal that repeats rising or falling and transitions between a high level and a low level. The timing diagram 502 of the M-th control signal SIG_M in a normal-signal state may correspond to the first timing diagram 400_1. On the contrary, referring to the timing diagram 504 of the M-th control signal SIG_M in a defective-signal state, a portion of a waveform of the M-th control signal SIG_M may be deformed, e.g., due to a defect in resistance. The defect in resistance is only an example, and the M-th control signal SIG_M may be a defective signal due to various other reasons. According to the timing diagram 506 of the representative clock signal CLK, the representative clock signal CLK may be a square wave signal of which logic high and logic low appear periodically.

Hereinafter, it is assumed that a duration in which logic high is maintained when the M-th control signal SIG_M is a normal signal is 8 μs, and a period T of the representative clock signal CLK is 1 μs. Referring to FIG. 5, logic high may be maintained for a time corresponding to times t0 to t1. An interval corresponding to times t0 to t1 and an interval corresponding to times t2 to t3 may respectively correspond to the first high interval TH_1 and the second high interval TH_2 of the first timing diagram 400_1.

For the case in which the M-th control signal SIG_M is a normal signal, a duration corresponding to the first high interval TH_1 in which logic high is maintained is 8 μs, and a period T of the representative clock signal CLK is T=1 μs, the counter block 24 (in FIG. 2) (or the counter circuit 306a) may generate '8' as a count result value. Accordingly, the comparator block 26 (in FIG. 2) (or the comparator circuit 309) may receive 8, which is an expected value and also the representative target count value EXP, compare the representative target count value EXP with an actual count number '8' of the M-th control signal SIG_M, which is a normal signal, and output a result value corresponding to a pass.

For the case in which the M-th control signal SIG_M is a defective signal, a duration in which logic high is maintained is about 6 μs, and a period T of the representative clock signal CLK is T=1 μs, the counter block 24 (in FIG. 2) (or the counter circuit 306a) may generate '6' as a count result value. Accordingly, the comparator block 26 (in FIG. 2) (or the comparator circuit 309) may receive 8, which is an expected value and the representative target count value EXP, compare the representative target count value EXP with an actual count number '6' of the M-th control signal SIG_M, which is a defective signal, and output a result value corresponding to a failure.

Figure 6:
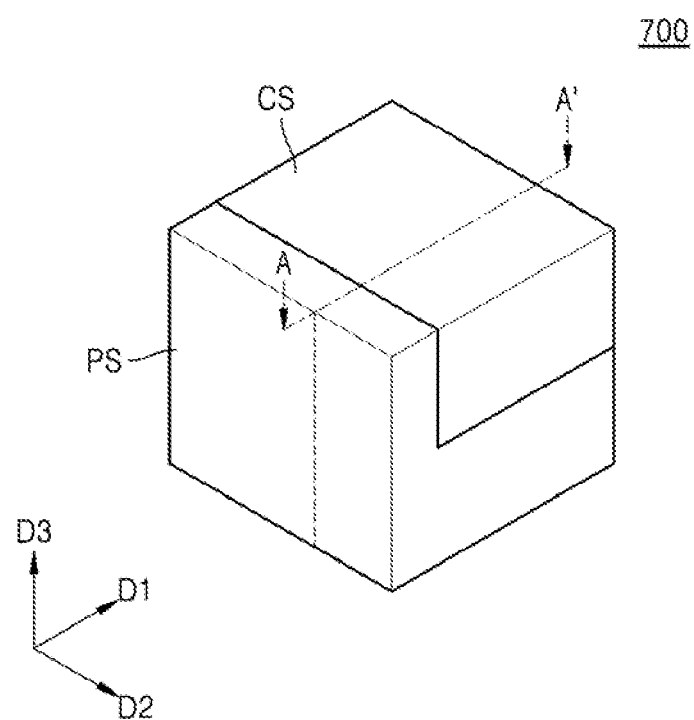
FIG. 6 is a schematic perspective view of a semiconductor memory device according to an example embodiment.
Figure 7:
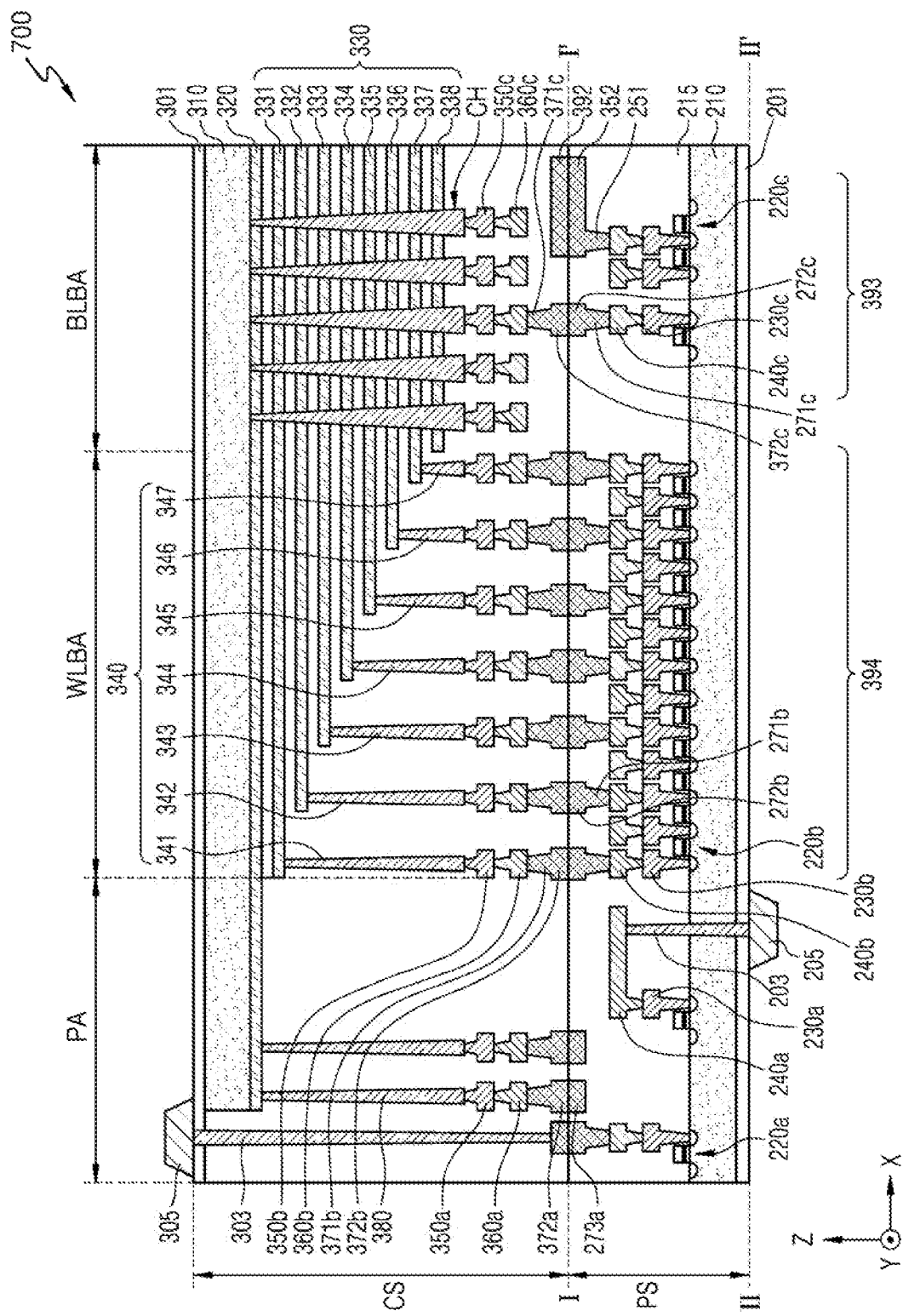
FIG. 7 is a cross-sectional view of the semiconductor memory device taken along line A-A' of FIG. 6, according to an example embodiment.

FIG. 6 is a schematic perspective view of a semiconductor memory device 700 according to an example embodiment. FIG. 7 is a cross-sectional view of the semiconductor memory device 700 taken along line A-A' of FIG. 6, according to an example embodiment.

Referring to FIGS. 6 and 7, the semiconductor memory device 700 may include a peripheral circuit area PS and a memory cell area CS.

The peripheral circuit area PS may include a buried area and a non-buried area, wherein the buried area is an area in which the peripheral circuit area PS planarly overlaps the memory cell area CS in a third direction D3, and the non-buried area is an area in which the peripheral circuit area PS does not planarly overlap the memory cell area CS in the third direction D3. In addition, although not included in the non-buried area, the peripheral circuit area PS may include a portion of an upper wiring body (not shown) arranged in the memory cell area CS.

The memory cell area CS may include at least one of the plurality of memory cell blocks BLK1 to BLKn of the memory cell array area 20 in FIG. 1, and the peripheral circuit area PS may include the peripheral circuit area 30.

Referring to FIG. 7, the semiconductor memory device 700 may have a chip-to-chip (C2C) structure. The C2C structure may mean a structure in which an upper chip including the memory cell area CS is manufactured on a first wafer, a lower chip including the peripheral circuit area PS is manufactured on a second wafer that is different from the first wafer, and then the upper chip and the lower chip are connected to each other by a bonding method. For example, the bonding method may refer to a method of electrically connecting a bonding metal formed on an uppermost metal layer of the upper chip and a bonding metal formed on an uppermost metal layer of the lower chip to each other. For example, when the bonding metals include copper (Cu), the bonding method may be a Cu—Cu bonding method, and the bonding metals may include aluminum or tungsten.

Each of the peripheral circuit area PS and the memory cell area CS of the semiconductor memory device 700 may include an external pad bonding area PA, a word line bonding area WLBA, and a bit line bonding area BLBA.

The peripheral circuit area PS may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c respectively formed on the first metal layers 230a, 230b, and 230c. In an example embodiment, the first metal layers 230a, 230b, and 230c may each include tungsten having a relatively high resistance, and the second metal layers 240a, 240b, and 240c may each include Cu having a relatively low resistance.

Herein, although only the first metal layers 230a, 230b, and 230c and the second metal layers 240a, 240b, and 240c are shown and described, at least one metal layer may be further formed on the second metal layers 240a, 240b, and 240c. At least a portion of the at least one metal layer formed on the second metal layers 240a, 240b, and 240c may include aluminum having a lower resistance than that of Cu forming the second metal layers 240a, 240b, and 240c.

The interlayer insulating layer 215 may be arranged on the first substrate 210 to cover the plurality of circuit elements 220a, 220b, and 220c, the first metal layers 230a, 230b, and 230c, and the second metal layers 240a, 240b, and 240c, and may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit area PS may be electrically connected to upper bonding metals 371b and 372b in the memory cell area CS by a bonding method, and the lower bonding metals 271b and 272b and the upper bonding metals 371b and 372b may each include aluminum, Cu, tungsten, or the like.

The memory cell area CS may provide at least one of the plurality of memory cell blocks BLK1 to BLKn (in FIG. 1). The memory cell area CS may include a second substrate 310 and a common source line 320. Word lines 330 including a plurality of word lines 331 to 338 may be stacked on the second substrate 310 along a Z-axis direction perpendicular to an upper surface of the second substrate 310. String selection lines and a ground selection line may be respectively arranged on upper and lower portions of the word lines 330, and the plurality of word lines 331 to 338 may be between the string selection lines and the ground selection line.

In the bit line bonding area BLBA, a channel structure CH may extend in the Z-axis direction perpendicular to the upper surface of the second substrate 310 to pass through the word lines 330, the string selection lines, and the ground selection line. The channel structure CH may include a data storage layer, a channel layer, and a buried insulating layer, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a Y-axis direction parallel to the upper surface of the second substrate 310.

In the example embodiment shown in FIG. 7, an area in which the channel structure CH, the bit line 360c, or the like are arranged may be defined as the bit line bonding area BLBA. In the bit line bonding area BLBA, the bit line 360c may be electrically connected to the circuit elements 220c providing a page buffer 393 in the peripheral circuit area PS. For example, the bit line 360c may be connected to upper bonding metals 371c and 372c in the peripheral circuit area PS, and the upper bonding metals 371c and 372c may be connected to lower bonding metals 271c and 272c connected to the circuit elements 220c of the page buffer 393.

In the word line bonding area WLBA, the word lines 330 may extend in an X-axis direction parallel to the upper surface of the second substrate 310, and may respectively be connected to cell contact plugs 340 including a plurality of cell contact plugs 341 to 347. The word lines 330 and the cell contact plugs 340 may be connected to each other at pads provided by extending at least some of the word lines 330 in different lengths in the X-axis direction. A first metal layer 350b and a second metal layer 360b may be sequentially connected to each of upper portions of the cell contact plugs 340 respectively connected to the word lines 330. In the word line bonding area WLBA, the cell contact plugs 340 may be connected to the peripheral circuit area PS via the upper bonding metals 371b and 372b in the memory cell area CS and the lower bonding metals 271b and 272b in the peripheral circuit area PS.

The cell contact plugs 340 may be electrically connected to the circuit elements 220b providing a row decoder 394 in the peripheral circuit area PS. In an example embodiment, an operating voltage of the circuit elements 220b providing the row decoder 394 may be different from an operating voltage of the circuit elements 220c providing the page buffer 393. For example, the operating voltage of the circuit elements 220c providing the page buffer 393 may be greater than the operating voltage of the circuit elements 220b providing the row decoder 394.

A common source line contact plug 380 may be disposed in the external pad bonding area PA. The common source line contact plug 380 may include a metal, a metal compound, or a conductive material such as polysilicon, and may be electrically connected to the common source line 320. A first metal layer 350a and a second metal layer 360a may be sequentially stacked on the common source line contact plug 380. For example, an area in which the common source line contact plug 380, the first metal layer 350a, and the second metal layer 360a are arranged may be defined as the external pad bonding area PA.

First and second input/output pads 205 and 305 may be disposed in the external pad bonding area PA. Referring to FIG. 7, a lower insulating film 201 covering a lower surface of the first substrate 210 may be arranged below the first substrate 210, and the first input/output pad 205 may be formed on the lower insulating film 201. The first input/output pad 205 may be connected to at least one of the plurality of circuit elements 220a, 220b, and 220c arranged in the peripheral circuit area PS via a first input/output contact plug 203, and may be separated from the first substrate 210 by the lower insulating film 201. In addition, a side-surface insulating film may be arranged between the first input/output contact plug 203 and the first substrate 210 to electrically separate the first input/output contact plug 203 from the first substrate 210.

Referring to FIG. 7, an upper insulating film 301 covering the upper surface of the second substrate 310 may be formed on the second substrate 310, and the second input/output pad 305 may be formed on the upper insulating film 301. The second input/output pad 305 may be connected to at least one of the plurality of circuit elements 220a, 220b, and 220c arranged in the peripheral circuit area PS via a second input/output contact plug 303.

According to an example embodiment, the second substrate 310, the common source line 320, or the like may not be arranged in an area in which the second input/output contact plug 303 is arranged. In addition, the second input/output pad 305 may not overlap the common source line contact plug 380 in the third direction D3. Referring to FIG. 7, the second input/output contact plug 303 may be separated from the second substrate 310 in a direction parallel to the upper surface of the second substrate 310, and may be connected to the second input/output pad 305 by passing through the upper insulating film 301 of the memory cell area CS.

According to an example embodiment, the first input/output pad 205 and the second input/output pad 305 may be optionally formed. For example, the semiconductor memory device 700 may include only the first input/output pad 205 disposed on the lower insulating film 201, or may include only the second input/output pad 305 disposed on the upper insulating film 301. Alternatively, the semiconductor memory device 700 may also include both the first input/output pad 205 and the second input/output pad 305.

In each of the external pad bonding area PA and the bit line bonding area BLBA in each of the memory cell area CS and the peripheral circuit area PS, there is a metal pattern of an uppermost metal layer as a dummy pattern, or the uppermost metal layer may be empty.

In the external pad bonding area PA, the semiconductor memory device 700 may correspond to an upper metal pattern 372a formed on an uppermost metal layer in the memory cell area CS to form, on an uppermost metal layer in the peripheral circuit area PS, a lower metal pattern 273a having the same shape as that of the upper metal pattern 372a in the memory cell area CS. The lower metal pattern 273a formed on the uppermost metal layer in the peripheral circuit area PS may not be connected to a separate contact in the peripheral circuit area PS. Similarly, in the external pad bonding area PA, the semiconductor memory device 700 may correspond to the lower metal pattern 273a formed on the uppermost metal layer in the peripheral circuit area PS to form, on the uppermost metal layer in the memory cell area CS, the upper metal pattern 372a having the same shape as that of the lower metal pattern 273a in the peripheral circuit area PS.

The lower bonding metals 271b and 272b may be formed on the second metal layer 240b in the word line bonding area WLBA. In the word line bonding area WLBA, the lower bonding metals 271b and 272b in the peripheral circuit area PS may be electrically connected to the upper bonding metals 371b and 372b in the memory cell area CS by a bonding method.

In addition, in the bit line bonding area BLBA, the semiconductor memory device 700 may correspond to a lower metal pattern 352 formed on the uppermost metal layer in the peripheral circuit area PS to form, on the uppermost metal layer in the memory cell area CS, an upper metal pattern 392 having the same shape as that of the lower metal pattern 352 in the peripheral circuit area PS. A contact may not be formed on the upper metal pattern 392 on the uppermost metal layer in the memory cell area CS.

Figure 8:
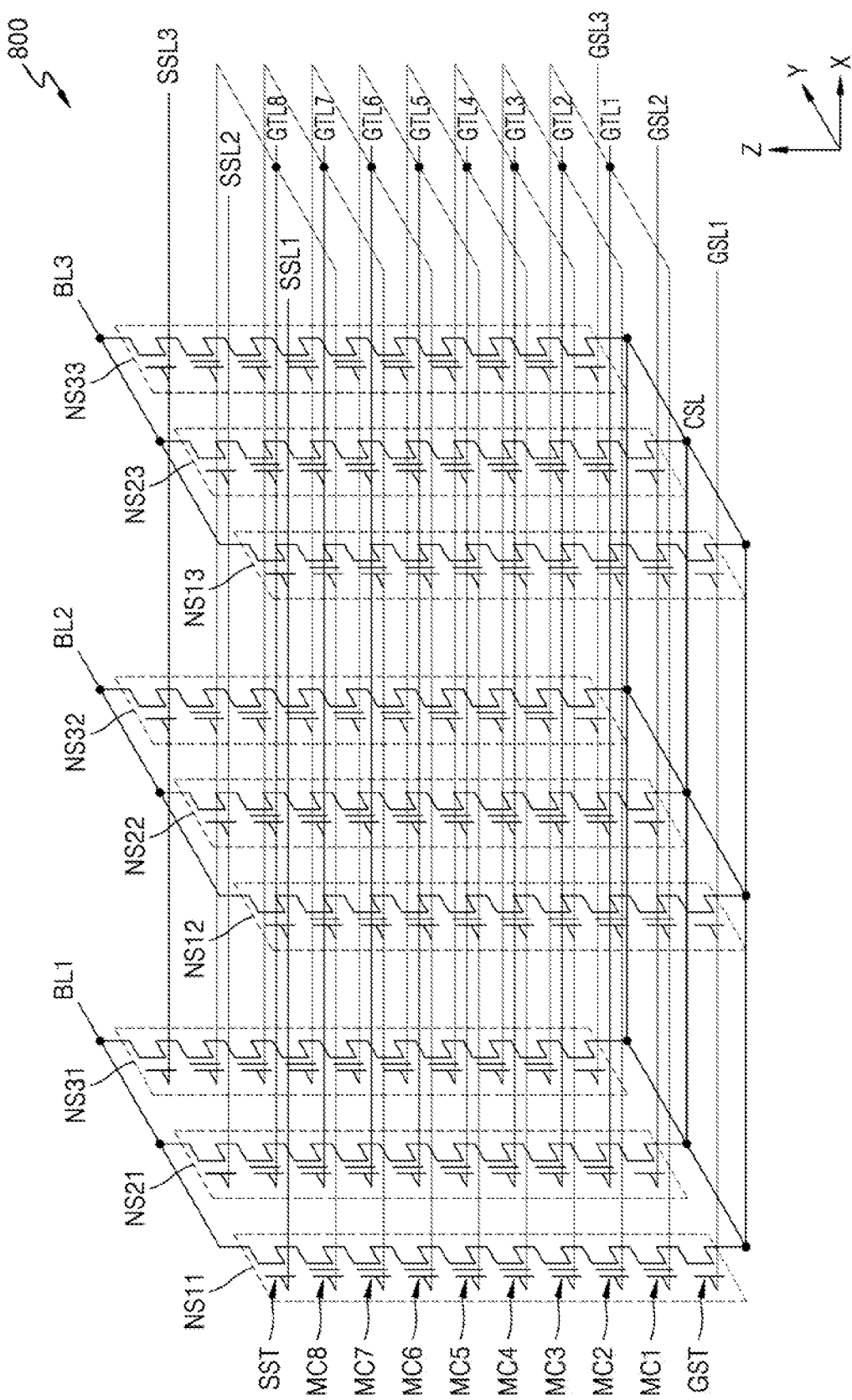
FIG. 8 is a circuit diagram illustrating one of a plurality of memory cell blocks in a semiconductor memory device according to an example embodiment.

FIG. 8 is a circuit diagram illustrating one of the plurality of memory cell blocks BLK1 to BLKn in the semiconductor memory device 10 according to an example embodiment. A memory block 800 shown in FIG. 8 may correspond to one of the plurality of memory cell blocks BLK1 to BLKn in FIG. 1.

The memory block 800 shown in FIG. 8 represents a three-dimensional memory block formed on a substrate in a three-dimensional structure. For example, a plurality of memory NAND strings in the memory block 800 may be formed in a direction perpendicular to the substrate.

Referring to FIG. 8, the memory block 800 may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1, MC2, ..., MC8, and a ground selection transistor GST. FIG. 8 illustrates that each of the plurality of memory NAND strings NS11 to NS33 includes eight memory cells MC1, MC2, ..., MC8, but the may be varied.

The string selection transistors SST of the plurality of memory NAND strings NS11 to NS33 may be connected to corresponding string selection lines SSL1, SSL2, and SSL3. The plurality of memory cells MC1, MC2, ..., MC8 may be connected to corresponding gate lines GTL1, GTL2, ..., GTL8, respectively. The gate lines GTL1, GTL2, ..., GTL8 may correspond to word lines, and some of the gate lines GTL1, GTL2, ..., GTL8 may correspond to dummy word lines. The ground selection transistors GST of the plurality of memory NAND strings NS11 to NS33 may be connected to corresponding ground selection lines GSL1, GSL2, and GSL3. The string selection transistors SST of the plurality of memory NAND strings NS11 to NS33 may be connected to the corresponding bit lines BL1, BL2, and BL3, and the ground selection transistors GST of the plurality of memory NAND strings NS11 to NS33 may be connected to the common source line CSL.

A gate line (e.g., GTL1) of the same height may be commonly connected, and the ground selection lines GSL1, GSL2, and GSL3 and the string selection lines SSL1, SSL2, and SSL3 may be separated from each other. FIG. 8 illustrates that in the memory block 800 includes the eight gate lines GTL1, GTL2, ..., GTL8 and the three bit lines BL1, BL2, and BL3, but this may be varied.

Figure 9:
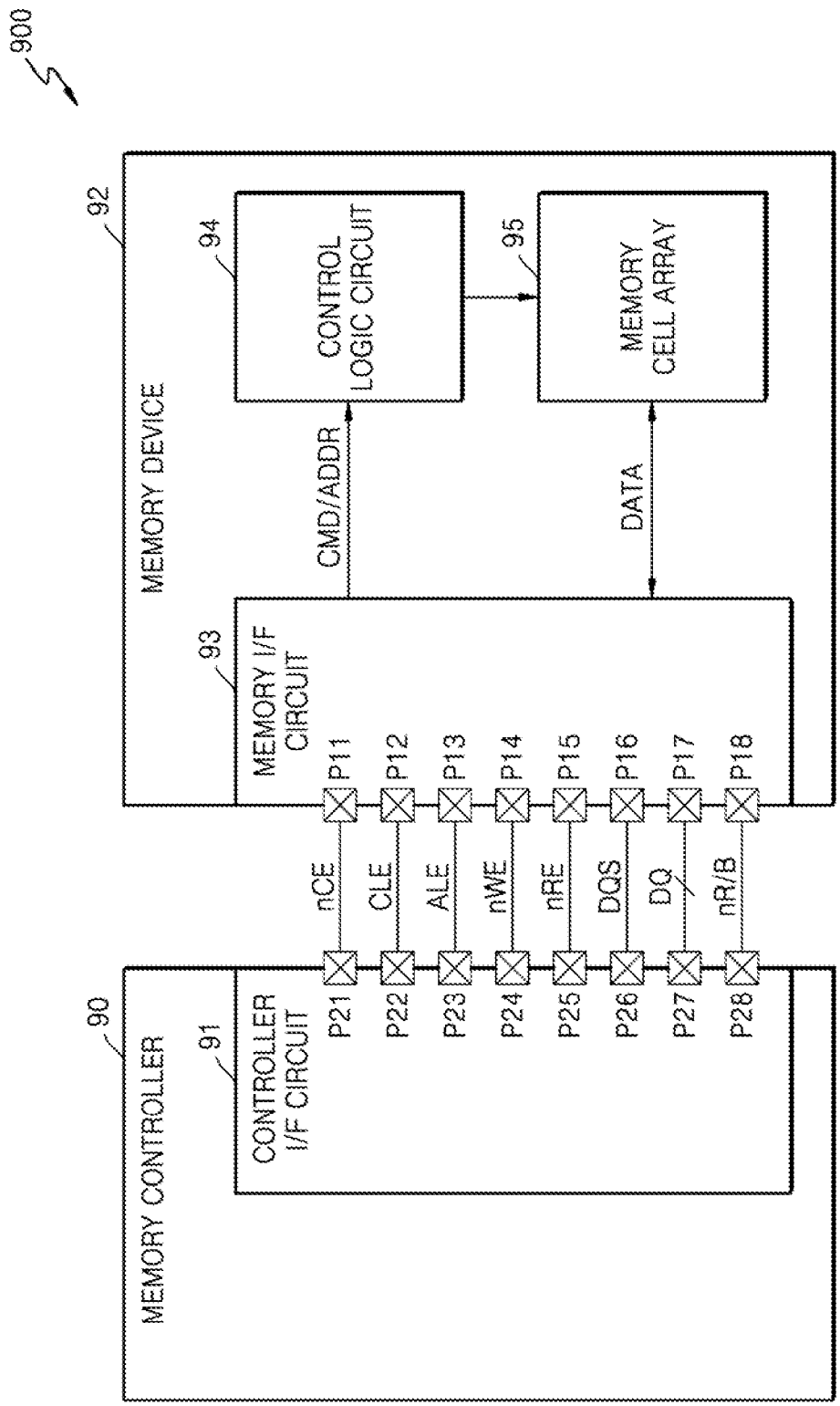
FIG. 9 is a block diagram of a memory system according to an example embodiment.

FIG. 9 is a block diagram of a memory system 900 according to an example embodiment.

The memory system 900 may include a memory device 92 and a memory controller 90.

The memory device 92 may include first to eighth pins P11 to P18, the memory I/F circuit 93, a control logic circuit 94, and a memory cell array 95. The memory device 92 may correspond to the semiconductor memory device 10 in FIG. 1. The control logic circuit 94 may correspond to the control logic 37 of FIG. 1, and the memory cell array 95 may correspond to the memory cell array area 20 in FIG. 1.

The memory I/F circuit 93 may receive a chip enable signal nCE from the memory controller 90 via the first pin P11. The memory I/F circuit 93 may transmit and receive signals to and from the memory controller 90 via the second to eighth pins P12 to P18 according to the chip enable signal nCE. For example, when the chip enable signal nCE is in an enable state (for example, a low level), the memory I/F circuit 93 may transmit and receive signals to and from the memory controller 90 via the second to eighth pins P12 to P18.

The memory I/F circuit 93 may receive a command latch enable signal CLE, an address latch enable signal ALE, and a write enable signal nWE from the memory controller 90 respectively via the second to fourth pins P12 to P14. The memory I/F circuit 93 may receive or transmit a data signal DQ from or to the memory controller 90 via the seventh pin P17. A command CMD, an address ADDR, and data DATA may be transmitted through the data signal DQ. For example, the data signal DQ may be transmitted through a plurality of data signal lines. In this case, the seventh pin P17 may include a plurality of pins respectively corresponding to the plurality of data signal lines.

The memory I/F circuit 93 may obtain the command CMD from the data signal DQ received in an enable interval (e.g., a high level state) of the command latch enable signal CLE based on toggle timings of the write enable signal nWE. The memory I/F circuit 93 may obtain the address ADDR from the data signal DQ received in an enable interval (e.g., a high level state) of the address latch enable signal ALE based on the toggle timings of the write enable signal nWE.

In an example embodiment, the write enable signal nWE may maintain a static state (e.g., a high level or a low level) and then be toggled between the high level and the low level. For example, the write enable signal nWE may be toggled in an interval in which the command CMD or the address ADDR is transmitted. Accordingly, the memory I/F circuit 93 may obtain the command CMD or the address ADDR based on the toggle timings of the write enable signal nWE. At least one of the obtained commands CMD may be the M-th control signal SIG_M selected by the signal selection block 22 (in FIG. 1).

The memory I/F circuit 93 may receive a read enable signal nRE from the memory controller 90 via the fifth pin P15. The memory I/F circuit 93 may receive or transmit a data strobe signal DQS from or to the memory controller 90 via the sixth pin P16.

In a data output operation of the memory device 92, the memory I/F circuit 93 may receive, through the fifth pin P15 before outputting the data DATA, the read enable signal nRE that toggles. The memory I/F circuit 93 may generate the data strobe signal DQS that toggles, based on toggling of the read enable signal nRE. For example, the memory I/F circuit 93 may generate the data strobe signal DQS that starts toggling after a predetermined delay (e.g., tDQSRE) with respect to a toggling start time of the read enable signal nRE.

The memory I/F circuit 93 may transmit the data signal DQ including the data DATA based on a toggle timing of the data strobe signal DQS. Accordingly, the data DATA may be aligned with the toggle timing of the data strobe signal DQS and transmitted to the memory controller 90.

In a data input operation of the memory device 92, when the data signal DQ including the data DATA is received from the memory controller 90, the memory I/F circuit 93 may receive the data strobe signal DQS that toggles from the memory controller 90 together with the data DATA. The memory I/F circuit 93 may obtain the data DATA from the data signal DQ based on the toggle timing of the data strobe signal DQS. For example, the memory I/F circuit 93 may obtain the data DATA by sampling the data signal DQ at rising and falling edges of the data strobe signal DQS.

The memory I/F circuit 93 may transmit a ready/busy signal nR/B to the memory controller 90 via the eighth pin P18. The memory I/F circuit 93 may transmit state information of the memory device 92 to the memory controller 90 via the ready/busy signal nR/B. When the memory device 92 is in a busy state (that is, when internal operations of the memory device 92 are being performed), the memory I/F circuit 93 may transmit the ready/busy signal nR/B indicating the busy state to the memory controller 90. When the memory device 92 is in a ready state (that is, when the internal operations of the memory device 92 are not being performed or are being completed), the memory I/F circuit 93 may transmit the ready/busy signal nR/B indicating the ready state to the memory controller 90. For example, while the memory device 92 reads the data DATA from the memory cell array 95 in response to a page read command, the memory I/F circuit 93 may transmit the ready/busy signal nR/B indicating the busy state (e.g., a low level) to the memory controller 90. For example, while the memory device 92 is programming the data DATA to the memory cell array 95 in response to a program command, the memory I/F circuit 93 may transmit the ready/busy signal nR/B indicating the busy state to the memory controller 90.

The control logic circuit 94 may generally control various operations of the memory device 92. The control logic circuit 94 may receive the command/address CMD/ADDR obtained from the memory I/F circuit 93. The control logic circuit 94 may generate control signals for controlling other components of the memory device 92 according to the received command/address CMD/ADDR. For example, the control logic circuit 94 may generate various control signals for programming the data DATA to the memory cell array 95 or reading the data DATA from the memory cell array 95. At least one of the control signals may be the M-th control signal SIG_M selected by the signal selection block 22 (in FIG. 1).

The memory cell array 95 may store the data DATA obtained from the memory I/F circuit 93 under the control by the control logic circuit 94. The memory cell array 95 may output the stored data DATA to the memory I/F circuit 93 under the control by the control logic circuit 94.

The memory cell array 95 may include a plurality of memory cells. For example, the plurality of memory cells may be flash memory cells. In the above, example embodiments have been described in which memory cells are NAND flash memory cells, but the memory cells may include resistive random access memory (RRAM) cells, ferroelectric random access memory (FRAM) cells, phase change random access memory (PRAM) cells, thyristor random access memory (TRAM) cells, magnetic random access memory (MRAM) cells, etc.

The memory controller 90 may include first to eighth pins P21 to P28 and a controller I/F circuit 91. The first to eighth pins P21 to P28 may respectively correspond to the first to eighth pins P11 to P18 of the memory device 92.

The controller I/F circuit 91 may transmit the chip enable signal nCE to the memory device 92 via the first pin P21. The controller I/F circuit 91 may transmit and receive signals, via the second to eighth pins P22 to P28, with the memory device 92 selected through the chip enable signal nCE.

The controller I/F circuit 91 may transmit the command latch enable signal CLE, the address latch enable signal ALE, and the write enable signal nWE to the memory device 92 respectively via the second to fourth pins P22 to P24. The controller I/F circuit 91 may transmit or receive the data signal DQ to or from the memory device 92 via the seventh pin P27.

The controller I/F circuit 91 may transmit the data signal DQ including the command CMD or the address ADDR to the memory device 92 together with the write enable signal nWE that toggles. The controller I/F circuit 91 may transmit the data signal DQ including the command CMD to the memory device 92 as the command latch enable signal CLE having an enable state is transmitted, and may transmit the data signal DQ including the address ADDR to the memory device 92 as the address latch enable signal ALE having an enable state is transmitted.

The controller I/F circuit 91 may transmit the read enable signal nRE to the memory device 92 via the fifth pin P25. The controller I/F circuit 91 may receive or transmit the data strobe signal DQS from or to the memory device 92 via the sixth pin P26.

In the data output operation of the memory device 92, the controller I/F circuit 91 may generate the read enable signal nRE that toggles, and transmit the read enable signal nRE to the memory device 92. For example, the controller I/F circuit 91 may generate the read enable signal nRE that changes from a static state (e.g., a high level or a low level) to a toggle state before the data DATA is output. Accordingly, the data strobe signal DQS that toggles may be generated in the memory device 92 based on the read enable signal nRE. The controller I/F circuit 91 may receive the data signal DQ including the data DATA together with the data strobe signal DQS that toggles from the memory device 92. The controller I/F circuit 91 may obtain the data DATA from the data signal DQ based on the toggle timing of the data strobe signal DQS.

In the data input operation of the memory device 92, the controller I/F circuit 91 may generate the data strobe signal DQS that toggles. For example, the controller I/F circuit 91 may generate the data strobe signal DQS that changes from a static state (e.g., a high level or a low level) to a toggle state before the data DATA is transmitted. The controller I/F circuit 91 may transmit the data signal DQ including the data DATA to the memory device 92 based on the toggle timings of the data strobe signal DQS.

The controller I/F circuit 91 may receive the ready/busy signal nR/B from the memory device 92 via the eighth pin P28. The controller I/F circuit 91 may determine the state information of the memory device 92 based on the ready/busy signal nR/B.

By way of summation and review, in a three-dimensional integrated circuit (in which memory cells are stacked three-dimensionally on a peripheral circuit for an operation of a semiconductor memory device), when a defect occurs inside a semiconductor memory chip, a malfunction of the semiconductor memory chip may occur. Thus, a test for detecting whether a malfunction has occurred and a cause of the defect may be performed. Because there may be numerous signals input or output to or from the inside of a peripheral circuit for an operation of a semiconductor memory device, it may be difficult to detect or interpret which signal causes the malfunction of a semiconductor memory chip.

As described above, embodiments relate to a semiconductor device and an operating method thereof, the semiconductor device including a defect detection circuit for detecting defects in signals in a peripheral circuit area of a memory device.

Embodiments may provide a semiconductor memory device configured to select a particular signal from among internal signals of a semiconductor chip, measure an operation time interval of the particular signal by counting using a clock signal, and sense and detect a defect when the operation time interval is different from a target time interval.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a memory cell area including a memory cell array configured to store data; and
   a peripheral circuit area including:
   a control logic configured to control operations of the memory cell array, and to generate a plurality of input signals, and
   a defect detection circuit configured to;
   select a first input signal from among the plurality of input signals,
   generate a count result value by counting at least one time interval of the first input signal based on a clock signal, and
   detect a defect of the first input signal by comparing an expected value with the count result value,
   wherein the first input signal is one of the plurality of input signals,
   wherein the at least one time interval of the first input signal is a length of time in which logic low or logic high is maintained, and
   wherein the length of time of the at least one time interval of the first input signal is longer than a period of the clock signal.

2. The memory device as claimed in claim 1, wherein the defect detection circuit is further configured to select whether to count the first input signal when an operation state of the memory device is a ready state, or to count the first input signal when the operation state of the memory device is a busy state.

3. The memory device as claimed in claim 1, wherein the at least one time interval is selected from one of:
   each of all time intervals in which logic low and logic high are respectively maintained after a first toggling to logic low, each of all time intervals in which logic low and logic high are respectively maintained after the first toggling to logic high, each of all time intervals in which logic low is maintained, or each of all time intervals in which logic high is maintained.

4. The memory device as claimed in claim 1, wherein:
the plurality of input signals include internal interface signals of the peripheral circuit area, and
the first input signal is selected from among the plurality of input signals according to an external command.

5. The memory device as claimed in claim 1, wherein the clock signal is determined to be one of:
a clock signal output from an oscillator in the peripheral circuit area, or
an external input clock signal.

6. The memory device as claimed in claim 1, wherein the expected value is determined to be a value of a combination or an arithmetic operation of information related to the first input signal in an electrical-fuse (E-fuse) method, or an external input value.

7. The memory device as claimed in claim 1, wherein the defect detection circuit is further configured to:
output a result value corresponding to a pass when the expected value is equal to the count result value, and
output a result value corresponding to a failure when the expected value is different from the count result value.

8. A memory device, comprising:
a memory cell array configured to store data;
a finite state machine configured to output a plurality of state signals in response to a command for an operation of the memory cell array; and
a defect detection circuit configured to detect a defect of a first state signal by measuring a duration of the first state signal in the plurality of state signals, the defect detection circuit including:
a signal selection block configured to select the first state signal from among the plurality of state signals;
a counter block configured to generate a count value by counting one duration of the first state signal based on a clock signal when the first state signal is at least one of logic 1 and logic 0; and
a comparator block configured to output a comparison result value according to a comparison result of an expected value and the count value,
wherein the first state signal is one of the plurality of state signals, and
wherein the one duration of the first state signal is longer than a period of the clock signal.

9. The memory device as claimed in claim 8, wherein:
the first state signal includes time intervals in which a plurality of logic 1s are maintained and time intervals in which a plurality of logic 0s are maintained, and
the counter block is further configured to measure each duration of the time intervals in which the plurality of logic 0s are maintained by using a clock signal, or measure each duration of the time intervals in which the plurality of logic 1s are maintained, using the clock signal.

10. The memory device as claimed in claim 9, wherein the counter block is further configured to count each of a duration of an interval in which at least one of the plurality of logic 0s is maintained, and a duration of an interval in which at least one of the plurality of logic 1s is maintained, after the first state signal is toggled to logic 0 or logic 1.

11. The memory device as claimed in claim 8, wherein the counter block is further configured to select whether to count the first state signal when an operation state of the memory device is a ready state, or to count the first state signal when the operation state of the memory device is a busy state.

12. The memory device as claimed in claim 8, wherein:
the counter block includes a first sub-counter circuit and a second sub-counter circuit,
the first sub-counter circuit is configured to generate a first count value by counting the duration of the at least one of logic 1 and logic 0 at a rising edge of a clock signal, and
the second sub-counter circuit is configured to generate a second count value by counting the duration of the at least one of logic 1 and logic 0 at a falling edge of the clock signal.

13. The memory device as claimed in claim 12, wherein the signal selection block includes a first multiplexer that is configured to receive the plurality of state signals, select the first state signal based on an external input, and output the first state signal to the counter block.

14. The memory device as claimed in claim 13, wherein:
the counter block is further configured to receive the clock signal and the first state signal, and output the count value to the comparator block, and
the clock signal is selected, by a second multiplexer of the counter block, from one of:
a clock signal output from an oscillator, or
an external input clock signal.

15. The memory device as claimed in claim 14, wherein:
the comparator block is further configured to receive the expected value and the count value, and determine whether the count value is equal to the expected value, and
the expected value is selected, by a third multiplexer of the comparator block, from one of:
an external input value, or
a built-in self test value.

16. A defect detection method of a memory device, the method comprising:
selecting a first control signal from among a plurality of control signals;
generating a count result value by counting, after the first control signal is first toggled, a time interval, in which a high level or a low level is maintained, based on a representative clock signal;
comparing the count result value of the first control signal with a representative target count value; and
detecting that the first control signal is defective when the count result value is different from the representative target count value,
wherein the first control signal is independently counted for each of time intervals in which the high level and the low level are respectively maintained,
wherein the first control signal is one of the plurality of control signals, and
wherein the time interval of the first control signal is longer than a period of the representative clock signal.

17. The method as claimed in claim 16, wherein the representative clock signal is selected from one of:
a first clock signal input from a memory controller, or
a second clock signal output from an oscillator in the memory device.

18. The method as claimed in claim 17, wherein the representative target count value is selected from one of:
a first target count value input from the memory controller, or a second target count value calculated from information related to an operation of the first control signal.

19. The method as claimed in claim 18, wherein:
the plurality of control signals include interface signals configured to control an operation of a memory cell array in the memory device, and
the selecting of the first control signal includes selecting the first control signal from among the plurality of control signals according to an external command input from the memory controller.

20. The method as claimed in claim 16, wherein the generating of the count result value includes:
counting the time interval at a rising edge of the representative clock signal by using a first counter circuit; and
counting the time interval at a falling edge of the representative clock signal by using a second counter circuit.

* * * * *